(12) United States Patent
Lee et al.

(10) Patent No.: US 7,129,568 B2
(45) Date of Patent: Oct. 31, 2006

(54) CHIP PACKAGE AND ELECTRICAL CONNECTION STRUCTURE BETWEEN CHIP AND SUBSTRATE

(75) Inventors: Sheng-Yuan Lee, Hsin-Tien (TW); Chi-Hsing Hsu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 78 days.

(21) Appl. No.: 10/938,730

(22) Filed: Sep. 9, 2004

(65) Prior Publication Data
US 2005/0082645 A1   Apr. 21, 2005

(30) Foreign Application Priority Data
Oct. 16, 2003  (TW) ............................... 92128671 A

(51) Int. Cl.
*H01L 23/495*  (2006.01)
(52) U.S. Cl. .............. 257/666; 257/E21.504; 257/E23.049; 437/217
(58) Field of Classification Search ........ 257/E21.504, 257/E23.049; 437/217, 209, 214, 220
See application file for complete search history.

(56) References Cited

U.S. PATENT DOCUMENTS 5,382,546 A * 1/1995 Yamada et al. ............... 29/827

* cited by examiner

*Primary Examiner*—Mai-Huong Tran
(74) *Attorney, Agent, or Firm*—J.C. Patents

(57) ABSTRACT

A chip package has lead frame, chip, generic wires, at least one characterized wire, ground wires and insulation material. The lead frame includes die pad, generic leads and at least a characterized lead structure. Generic leads and the characterized lead structure are aligned at peripheral region of the die pad. The characterized lead structure has a cross-sectional area perpendicular to the direction where signals transmit, which is larger than each generic lead. The chip is on the die pad. The generic wires connect the chip to the generic leads. The characterized wire connects the chip to the characterized lead structure. The characterized wire is for transmitting an identical signal between the chip and the characterized lead structure. Ground wires connect the chip to the die pad, and are located at both sides of the characterized wires. The insulation material encapsulates lead frame, chip, generic wires, characterized wire and ground wires.

16 Claims, 8 Drawing Sheets

US 7,129,568 B2

CHIP PACKAGE AND ELECTRICAL CONNECTION STRUCTURE BETWEEN CHIP AND SUBSTRATE

CROSS-REFERENCE TO RELATED APPLICATION

This application claims the priority benefit of Taiwan application serial no. 92128671, filed on Oct. 16, 2003.

BACKGROUND OF THE INVENTION

1. Field of the Invention

The present invention relates to a chip package and an electrical connection structure between a chip and a substrate. More particularly, the present invention relates to a high performance chip package and electrical connection structure between a chip and a substrate.

2. Description of the Related Art

In an information society, everybody is searching for high speed, high quality and multifunctional electronic products. Other criteria for selecting a particular product may also include aesthetic appeal, weight and size. Most electronic products typically enclose a semiconductor chip and a carrier for electrically connecting with the semiconductor chip. At present, there are three major techniques for connecting a chip to a carrier, namely, a wire-bonding process, a flip-chip process and a tape-automated-bonding (TAB) process. If the carrier is a lead frame, the wire-bonding process is often used to connect the chip with the leads on the lead frame.

The quality of signal transmission between a chip and surrounding lead frame is frequently affected by minor difference in impedance between the bonded wires and the system. Any difference in wire impedance and system impedance may cause an impedance mismatch that results in signal reflection. If the impedance of the bonded wire is greater than the system impedance, a positive phase signal will be reflected. Conversely, if the impedance of the bonded wire is smaller than the system impedance, a negative phase signal will be reflected. Ideally, there is no signal reflection and it occurs when the impedance of the bonded wire matches the system impedance exactly. However, if the impedance mismatch between the bonded wires and the system is really large, the semiconductor chip may produce some computation errors.

FIG. 1A is a schematic cross-sectional view of a conventional chip package with a chip electrically connected to a lead frame using a wire-bonding process. FIG. 1B is a perspective view of the electrical connection structure between a chip and a substrate shown in FIG. 1A. As shown in FIGS. 1A and 1B, the chip package 100 comprises a chip 110, a lead frame 120, signal wires 130a, ground wires 130b and an insulation material 150. The lead frame 120 has a die pad 122 and a plurality of identical leads 124. The leads 124 are distributed evenly at the peripheral area of the die pad 122. The chip 110 is attached to the die pad 122 through adhesive glue 172. The signal wires 130a and the ground wires 130b connecting the chip 110 to the respective leads 124a and 124b are formed in a wire-bonding process. The die pad 122 and the lead 124b are electrically connected through pad 194 on a substrate 190 to provide an electrical ground. The insulation material 150 encapsulates the chip 110, the lead frame 120, the signal wires 130a and the ground wires 130b. The die pad 122 and the leads 124 of the chip package 100 are attached to the substrate 190 through the application of adhesive materials 174 and 176.

As shown in FIG. 1B, the chip 110 is electrically connected to the pad 192 of the substrate 190 through signal wires 130a, the leads 124a and the adhesive material 176. The ground wire 130b is located at both sides of the signal wire 130a to serve as an electrical shield. The ground wires 130b not only minimizes external electrical interference to the signal wire 130a during signal transmission, but also prevents the signal wire 130a from causing interference to other wires. Because each signal wire 130a has a small cross-sectional area and a long length, relatively high impedance is produced during high frequency signal transmission. When the impedance of the signal wire 130a deviates significantly from the system impedance, serious signal reflection occurs and the probability of producing computation errors in the chip 110 increases considerably.

FIG. 2A is a schematic cross-sectional view of another conventional chip package with a chip electrically connected to a lead frame using a wire-bonding process. FIG. 2B is a perspective view of the electrical connection structure between a chip and a substrate shown in FIG. 2A. The chip package is almost identical to the one in FIGS. 1A and 1B except for the bonding of additional ground wires 140 linking the chip 110 and the die pad 122.

SUMMARY OF THE INVENTION

Accordingly, the present invention is to provide a chip package and an electrical connection structure between a chip and a substrate capable of matching the impedance of wire-bonded transmission circuits with and system impedance.

To achieve these and other advantages and in accordance with the purpose of the invention, as embodied and broadly described herein, the invention provides a chip package. The chip package comprises a lead frame, a chip, a plurality of generic wires, at least a characterized wire, a plurality of ground wires and an insulation material. The lead frame comprises a die pad, a plurality of generic leads and at least a characterized lead structure. The generic leads and the characterized lead structure are aligned at the peripheral region of the die pad. The characterized lead structure has a cross-sectional area perpendicular to the direction where signals transmit, which is larger than that of each generic lead. The chip is mounted on the die pad. The generic wires respectively connect the chip through the generic leads. The characterized wire connects the chip through the characterized lead structure. The characterized wire is used for transmitting an identical signal between the chip and the characterized lead structure. The ground wires connect the chip to the die pad. The ground wires are located at both sides of the characterized wires. The insulation material encapsulates the lead frame, the chip, the generic wires, the characterized wire and the ground wires.

According to one preferred embodiment of this invention, the chip package comprises a plurality of characterized wires and the characterized lead structure comprises a plurality of characterized leads. The characterized leads have a profile identical to the generic leads. The characterized wires connect a same signal bonding pad on the chip to the characterized leads respectively. Furthermore, according to another embodiment of this invention, the characterized lead structure is a single block lead.

In brief, because the characterized lead structure is fabricated with a considerable volume, a capacitative effect is easily induced to compensate for the inductive effect of characterized wires. Hence, the impedance of the transmission circuit going through the characterized wire and the characterized lead structure can approximately match the impedance of the system. Therefore, computation errors in the chip due to signal reflection are significantly minimized.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
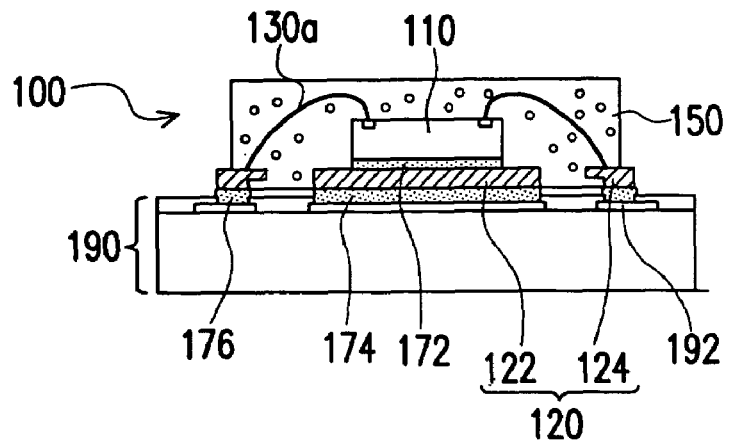
FIG. 1A is a schematic cross-sectional view of a conventional chip package with a chip electrically connected to a lead frame using a wire-bonding process.

Reference will now be made in detail to the present preferred embodiments of the invention, examples of which are illustrated in the accompanying drawings. Wherever possible, the same reference numbers are used in the drawings and the description to refer to the same or like parts.

FIRST EMBODIMENT

Figure 3:
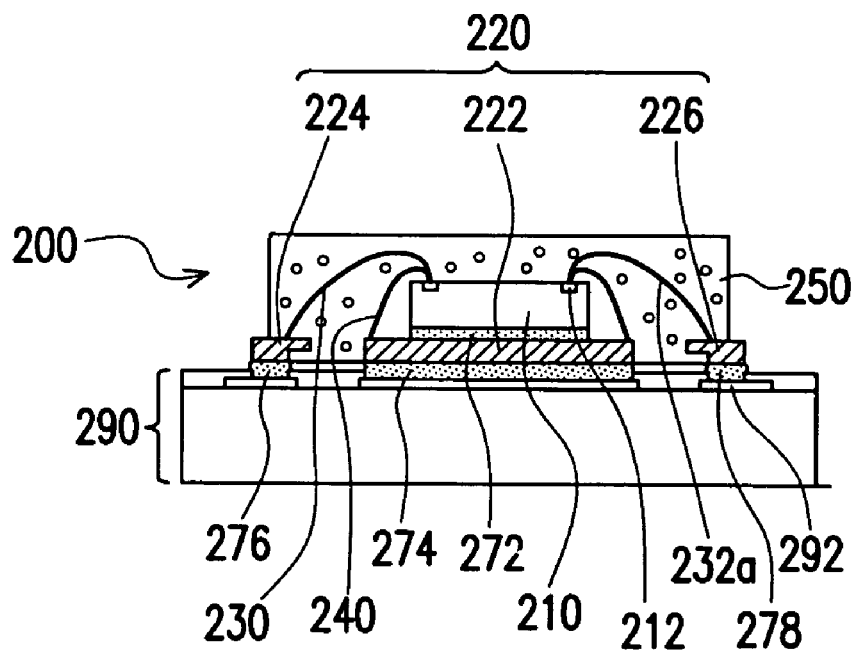
FIG. 3 is a schematic cross-sectional view of a chip package with a chip electrically connected to a lead frame using a wire-bonding process according to a first preferred embodiment of this invention.
Figure 4:
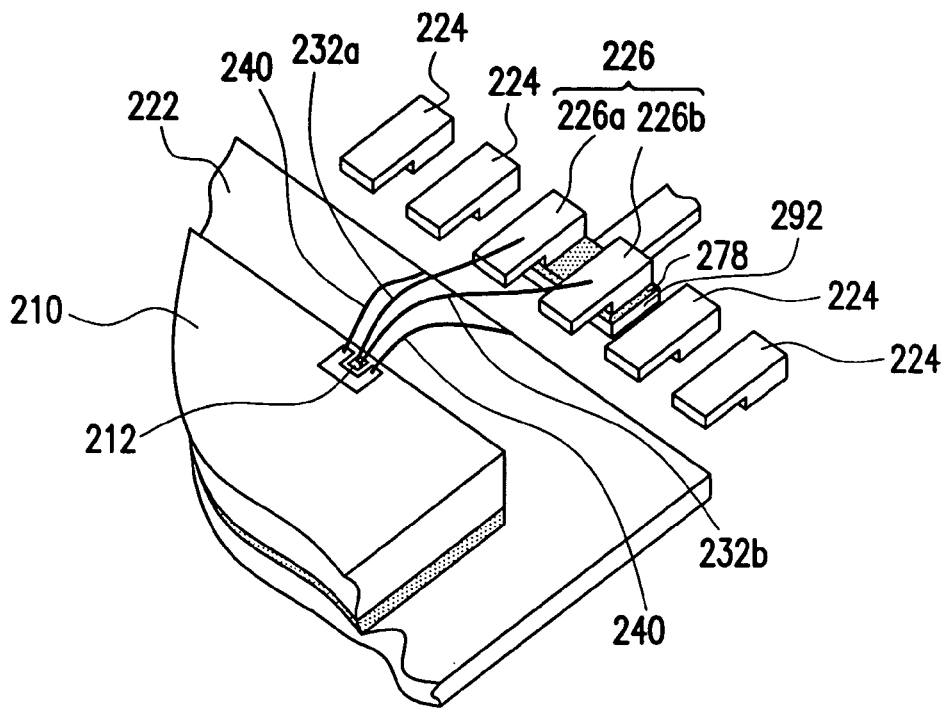
FIG. 4 is a perspective view showing the electrical connection between a chip and a substrate according to the first preferred embodiment of this invention.
Figure 5:
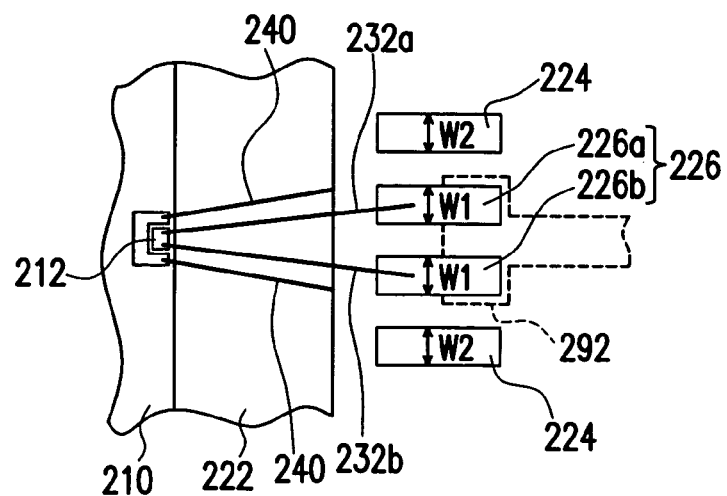
FIG. 5 is a top view showing the electrical connection between a chip and a substrate according to the first preferred embodiment of this invention.

FIG. 3 is a schematic cross-sectional view of a chip package with a chip electrically connected to a lead frame using a wire-bonding process according to a first preferred embodiment of this invention. FIG. 4 is a perspective view showing the electrical connection between a chip and a substrate according to the first preferred embodiment of this invention. FIG. 5 is a top view showing the electrical connection between a chip and a substrate according to the first preferred embodiment of this invention. As shown in FIGS. 3, 4 and 5, the chip package 200 comprises a chip 210, a lead frame 220, a plurality of generic wires 230, characterized wires 232a, 232b, ground wires 240 and an insulation material 250. The lead frame 220 comprises a die pad 222, a plurality of identical generic leads 224 and at least a characterized lead structure 226. In this embodiment, the characterized lead structure 226 is composed of two characterized leads 226a and 226b. In one example, the characterized leads 226a and 226b have a shape identical to the generic leads 224. Furthermore, the characterized leads 226a and 226b have a width w1 identical to the width w2 of the generic leads 224. The generic leads 224 and the characterized leads 226a, 226b are aligned at the peripheral region of the die pad 222. The two characterized leads 226a, 226b have a combined cross-sectional area perpendicular to the direction where signals transmit, which is greater than that of each generic lead 224. In other words, the characterized lead structure 226 has a cross-sectional area perpendicular to the direction where signals transmit, which is greater than that of each generic lead 224. In terms of volume, the combined volume of the two characterized leads 226a and 226b is greater than the volume of each generic lead 224. That means, the characterized lead structure 226 has a volume greater than that of each generic lead 224.

The chip 210 is attached to the die pad 222 with adhesive material 272. Through a wire-bonding process, the chip 210 is electrically connected to the generic leads 224, the characterized leads 226a, 226b and the die pad 222 by generic wires 230, characterized wires 232a, 232b and ground wires 240 respectively. The die pad 222 and the ground wires 240 are connected to provide an electrical ground. In this embodiment, the two characterized wires 232a and 232b connect a same signal bonding pad 212 on the chip 210 with the characterized leads 226a and 226b respectively. The insulation material 250 encapsulates the chip 210, the lead frame 220, the generic wires 230, the characterized wires 232a, 232b and the ground wires 240. The die pad 222, the general leads 224 and the characterized leads 226a, 226b are attached to a substrate 290 through adhesive material 274, 276 and 278. The characterized leads 226a, 226b are jointly connected to pad 292 on the substrate 290 through adhesive material 278.

As shown in FIGS. 4 and 5, the chip 210 is electrically connected to the pad 292 on the substrate 290 through the characterized wires 232a, 232b, the characterized leads 226a, 226b and adhesive material 278. The ground wires 240 are located at both sides of the characterized wires 232a, 232b used for signal transmission. Hence, the ground wires 240 can serve as a shield for reducing external interference to the characterized wires 232a, 232b during signal transmission. Also, the ground wires 240 reduce the interference to other wires when a signal transmits through the characterized wires 232a, 232b.

However, because the characterized wires 232a, 232b have a small cross-sectional area and a long length, an inductive effect is prominent during signal transmission. In this invention, the characterized lead structure 226 is a special design on the lead frame 220 that compensates for the inductive effect due to the characterized wires 232a, 232b. The characterized lead structure 226 has an overall volume greater than that of each generic lead 224. Since the characterized lead structure 226 has a relatively large cross-sectional area perpendicular to the direction of signal transmission, the characterized lead structure 226 provides a capacitative effect that compensates for the inductive effect of the characterized wires 232a and 232b. Thus, the transmission circuit combining the characterized wires 232a, 232b with the characterized lead structure 226 can provide an impedance close to the system impedance. In other words, computation errors in the chip due to signal reflection are significantly minimized. In addition, the design of a pair of characterized wires 232a and 232b connecting the same signal bonding pad 212 of the chip 210 with the lead frame 220 can compensate for the inductive effect in a conventional design caused by using just one wire.

In this embodiment, the same signal bonding pad 212 on the chip 210 is connected to the characterized leads 226a 226b through two characterized wires 232a and 232b. In other words, a same signal can be transmitted from the same signal bonding pad 212 of the chip 210 to the pad 292 on the substrate 290 through two separate circuit paths, namely, the characterized wire 232a and the characterized leads 226a as well as the characterized wire 232b and the characterized lead 226b. In practice, the arrangement is not limited as such. In general, a same signal bonding pad on the chip may connect to a pad on the substrate through a plurality of characterized wires and a plurality of characterized leads. For example, a same signal bonding pad on the chip may connect to three characterized leads through three characterized wires. That means, a same signal can be transmitted from the same signal bonding pad of the chip to a pad on the substrate through three characterized wires and three characterized leads. It is to be noted that the transmission circuit comprising the characterized wires 232a, 232b and the characterized leads 226a, 226b can be used for transmitting signals with high frequency.

SECOND EMBODIMENT

Figure 6:
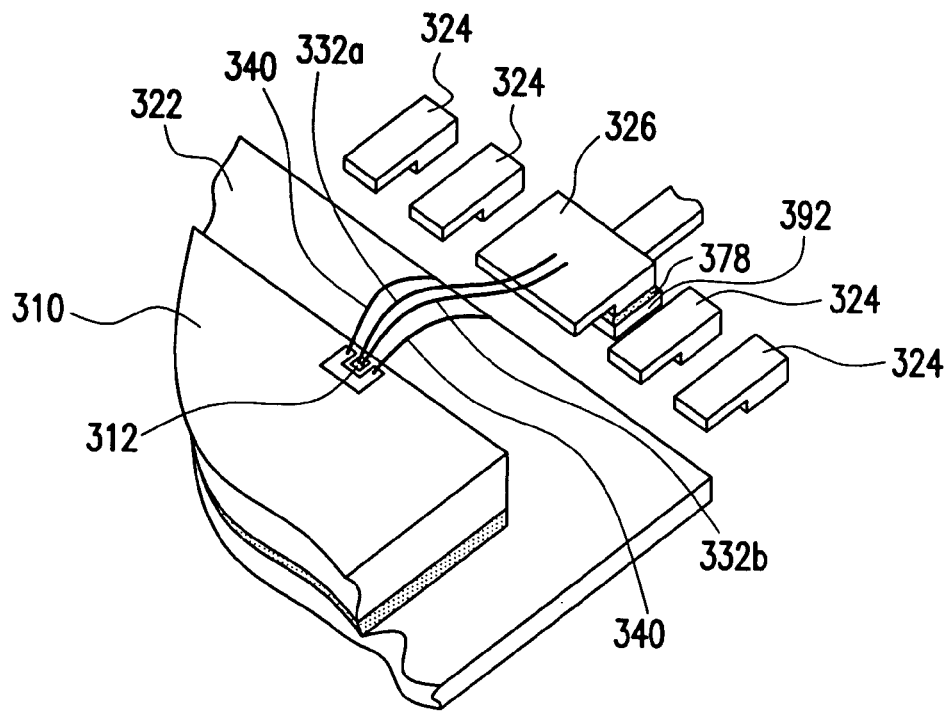
FIG. 6 is a perspective view showing the electrical connection between a chip and a substrate according to a second preferred embodiment of this invention.
Figure 7:
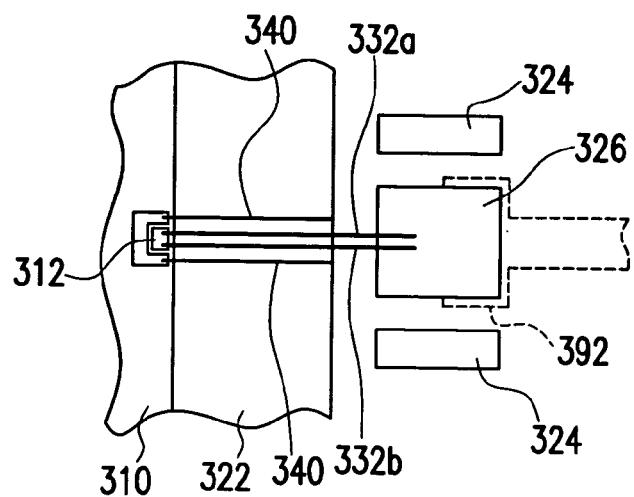
FIG. 7 is a top view showing the electrical connection between a chip and a substrate according to the second preferred embodiment of this invention.

FIG. 6 is a perspective view showing the electrical connection between a chip and a substrate according to a second preferred embodiment of this invention. FIG. 7 is a top view showing the electrical connection structure between a chip and a substrate according to the second preferred embodiment of this invention. This embodiment differs from the first embodiment mainly in the design of the characterized lead structure. Since all other elements are identical to that of the first embodiment, detail descriptions of these elements are omitted.

As shown in FIGS. 6 and 7, a chip 310 is electrically connected to a pad 392 on a substrate 390 through a pair of characterized wires 332a, 332b, a characterized lead structure 326 and adhesive material 378. The characterized lead structure 326 is fabricated as a single block lead. Generic leads 324 and the characterized lead structure 326 are aligned at a peripheral region around a die pad 322. The characterized lead structure 326 has a cross-sectional area perpendicular to the direction where signals transmit, which is greater than that of each generic lead 324. Hence, the characterized lead structure 326 has a volume larger than that of each generic lead 324. Because the characterized lead structure 326 has a relatively large cross-sectional area perpendicular to the direction of signal transmission, capacitative effect is induced in the characterized lead structure 326 thereby compensating for the inductive effect produced by the characterized wires 332a and 332b. Thus, the transmission circuit of combining the characterized wires 332a, 332b with the characterized lead structure 326 can provide impedance close to the system impedance. In other words, computation errors in the chip due to signal reflection are significantly minimized.

As shown in FIGS. 6 and 7, ground wires 340 are located at both sides of the characterized wires 332a, 332b used for signal transmission. Hence, the ground wires 340 can serve as a shield for reducing external interference to the characterized wires 332a, 332b during signal transmission. Also, the ground wires 340 can reduce the interference to other wires when a signal transmits through the characterized wires 332a, 332b.

Figure 8:
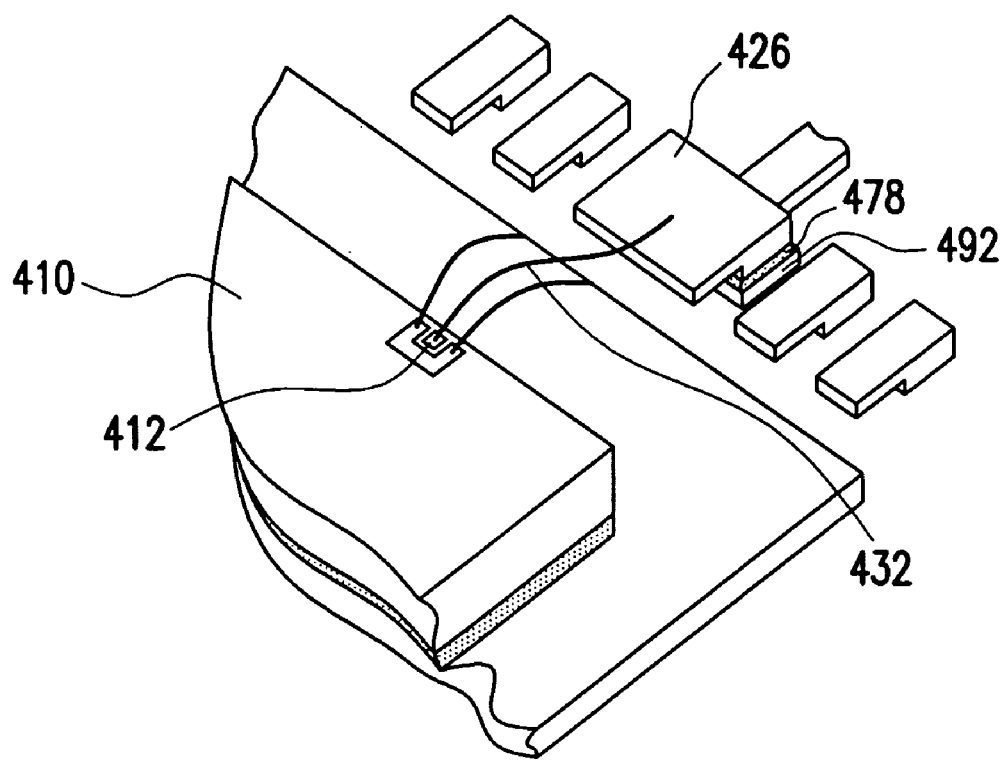
FIG. 8 is a perspective view showing an electrical connection between a chip and a substrate through a characterized wire according to the second preferred embodiment of this invention.

In this embodiment, the same signal bonding pad 312 on the chip 310 is connected to the characterized lead structure 326 shaped as a single block lead through two characterized wires 332a and 332b. In other words, a same signal can be transmitted from the same signal bonding pad 312 of the chip 310 to the pad 392 on the substrate 390 through two separate characterized wires 332a, 332b and the characterized lead structure 326. In practice, the arrangement is not limited as such. In general, a same signal bonding pad on the chip may connect to a pad on the substrate through a plurality of characterized wires and a characterized lead structure shaped as a single block lead. For example, a same signal bonding pad on the chip may connect to a characterized lead structure shaped as a single block lead through three characterized wires. That means, a same signal can be transmitted from the same signal bonding pad of the chip to a pad on the substrate through three characterized wires and a characterized lead structure shaped as a single block lead. However, an alternative setup shown in FIG. 8 is possible. FIG. 8 is a perspective view showing an electrical connection between a chip and a substrate through a characterized wire according to the second preferred embodiment of this invention. In FIG. 8, only one single characterized wire 432 is used to electrically connect the same signal bonding pad 412 on a chip 410 to a characterized lead structure 426 shaped as a single block lead. In other words, a same signal can be transmitted from the same signal bonding pad 412 of the chip 410 to a pad 492 through the characterized wire 432 and the characterized lead structure 426 shaped as a single block lead.

Experiment Result

Figure 1B:
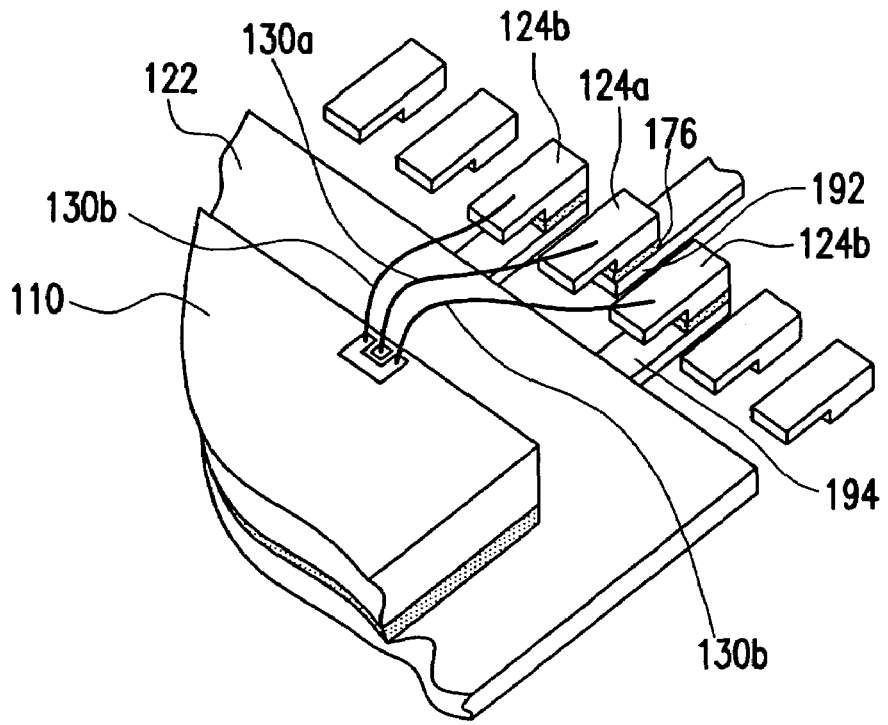
FIG. 1B is a perspective view of the electrical connection structure between a chip and a substrate shown in FIG. 1A.
Figure 2A:
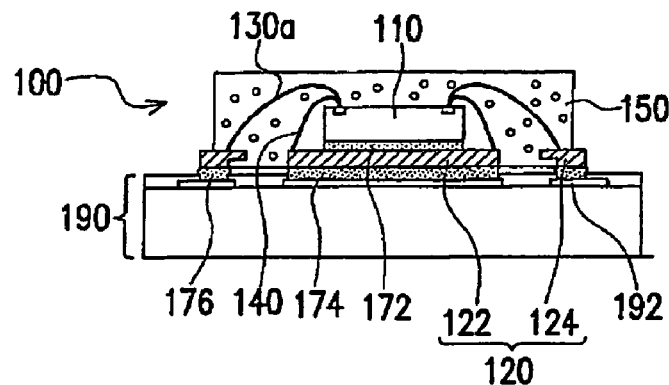
FIG. 2A is a schematic cross-sectional view of another conventional chip package with a chip electrically connected to a lead frame using a wire-bonding process.
Figure 2B:
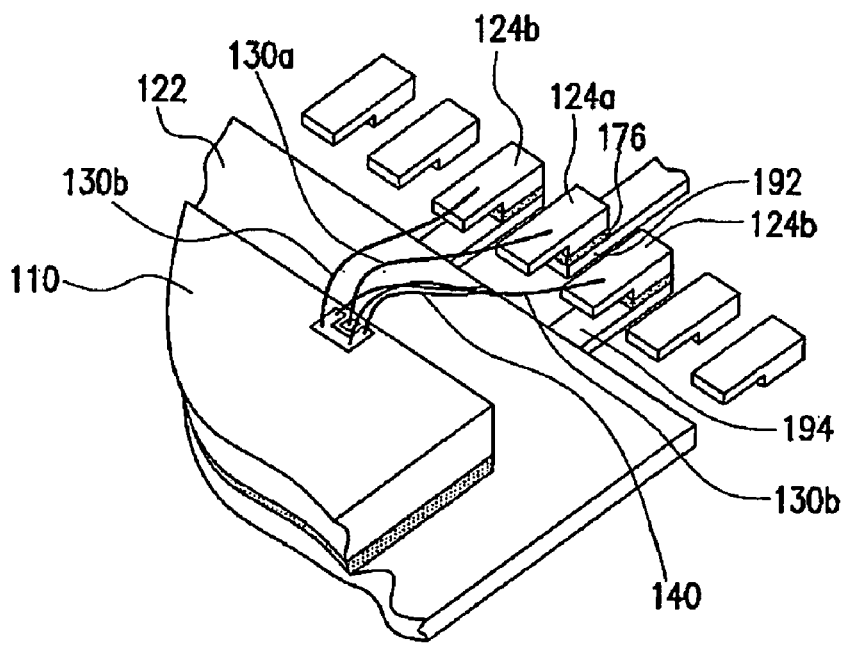
FIG. 2B is a perspective view showing the electrical connection between a chip and a substrate shown in FIG. 2A.

The electrical connection structure for connecting a chip to a substrate according to this invention and the conventional one is compared. Table 1 shows a lists of the frequency response of the structures in four cases A, B, C and D at operating frequencies 2.5 GHz, 5 GHz and 10 GHz respectively. Case A indicates the conventional structure shown in FIGS. 1A and 1B; case B indicates the structure shown in FIGS. 2A and 2B; case C indicates the structure shown in FIGS. 3, 4 and 5; case D indicates the structure shown in FIGS. 6 and 7.

TABLE 1

|  | 2.5 GHz | | 5 GHz | | 10 GHz | |
| --- | --- | --- | --- | --- | --- | --- |
|  | S22(dB) | S21(dB) | S22(dB) | S21(dB) | S22(dB) | S21(dB) |
| Case A | −18.6 | −0.16 | −12.9 | −0.41 | −6.7 | −1.46 |
| Case B | −26.6 | −0.10 | −21.2 | −0.18 | −14.9 | −0.43 |
| Case C | −26.7 | −0.09 | −21.4 | −0.17 | −16.3 | −0.37 |
| Case D | −29.9 | −0.08 | −24.7 | −0.15 | −17.3 | −0.35 |

Figure 9:
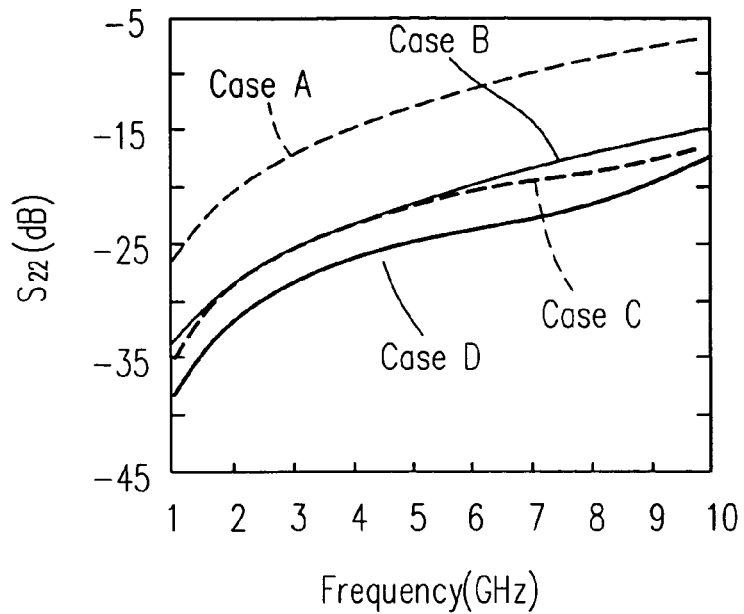
FIG. 9 is a graph showing the $S_{22}$ frequency response curves in various cases.
Figure 10:
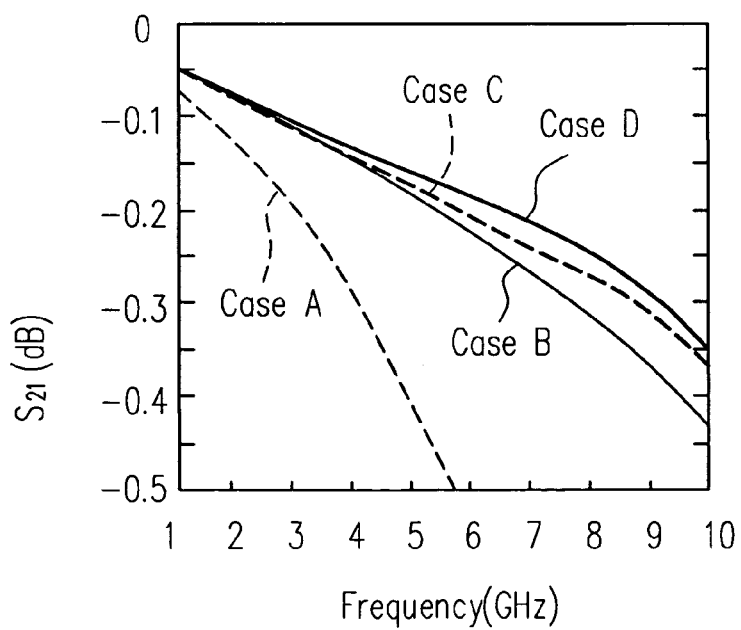
FIG. 10 is a graph showing the $S_{21}$ frequency response curves in various cases.
Figure 11:
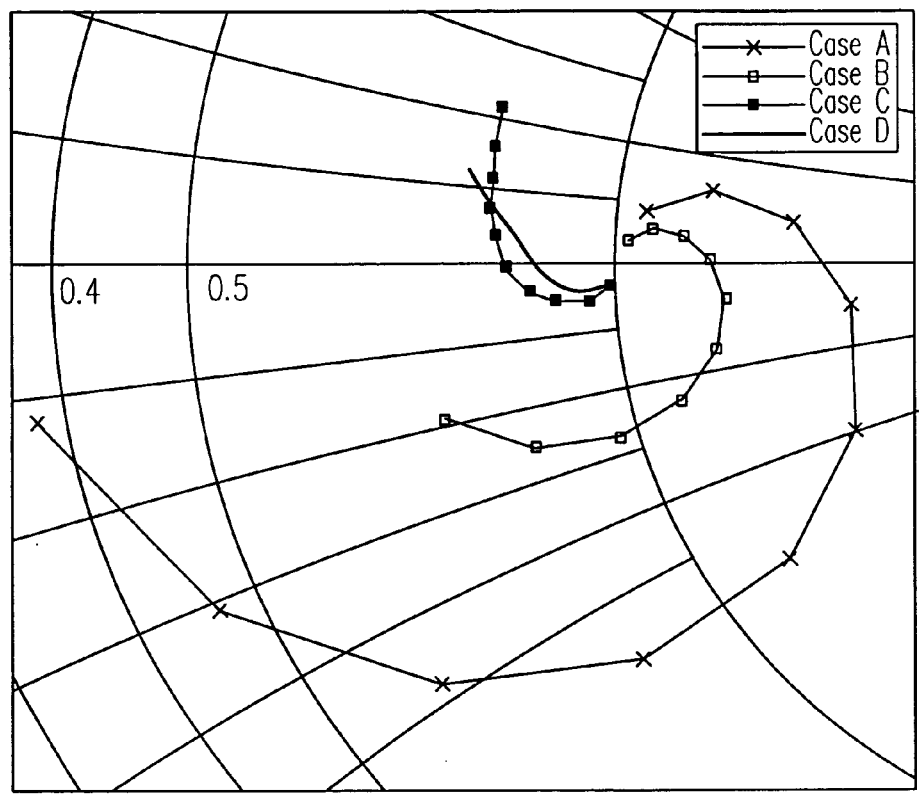
FIG. 11 is a Smith chart showing the frequency response curves in various cases.

Furthermore, FIG. 9 is a graph showing the $S_{22}$ frequency response curves relating to four cases. FIG. 10 is a graph showing the $S_{21}$ frequency response curves relating to four cases. FIG. 11 is a Smith chart showing the frequency response curves relating to four cases.

One major aspect of this invention is the setup of at least a characterized lead structure on a lead frame. The characterized lead structure has a volume greater than that of each generic lead. The characterized lead structure has a cross-sectional area perpendicular to the direction of signal transmission, which is greater than that of the generic lead. Therefore, an inductive effect produced by the characterized wires can be compensated. The concept of this invention has many applications. For example, the concept of this invention may be employed for a bent lead that extends to the outside of the insulation material. In other words, two leads of this kind may be electrically connected to a same signal bonding pad on a chip through a pair of characterized wires respectively so that a same signal can be transmitted from the chip to a substrate through the characterized wires and the bent leads. Alternatively, the characterized lead structure can be a single bent lead with a volume greater than that of each generic bent lead. In this case, the characterized lead structure may electrically connect to a same signal bonding pad on a chip through at least a single characterized wire to transmit a single signal between the chip and the substrate.

In summary, the electrical connection structure for connecting a chip with a substrate has a characterized lead structure with a volume larger than the generic leads. Therefore, the characterized lead structure can provide some capacitative effect that compensates for the inductive effect produced by characterized wires. With this setup, the transmission circuit composed of the characterized wires and the characterized lead structure can provide impedance that matches the system impedance. Therefore, computation errors in the chip due to signal reflection are significantly minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lead-frame package, comprising:
   a lead frame, comprising:
   a die pad;
   a plurality of generic leads; and
   at least a characterized lead structure having a cross-sectional area perpendicular to the direction of signal transmission greater than that of each generic lead;
   a chip attached to the die pad;
   a plurality of generic wires connecting the chip to the generic leads respectively;
   at least a characterized wire connecting the chip to the characterized lead structure, wherein the characterized lead structure is used for transmitting a single signal through the characterized wire; and
   an insulation material encapsulating the lead frame, the chip, the generic wires and the characterized wire.

2. The lead-frame package of claim 1, wherein the lead-frame package comprises a plurality of characterized wires, the characterized lead structure comprises a plurality of characterized leads, each of the plurality of characterized leads having a profile identical to the generic lead, and the characterized wires connect a same signal bonding pad on the chip to the characterized leads respectively.

3. The lead-frame package of claim 1, wherein the characterized lead structure is a single block lead.

4. The lead-frame package of claim 1, wherein the lead-frame package is suitable for joining to a substrate, the substrate comprises a pad electrically connected to the characterized lead structure.

5. The lead-frame package of claim 1, wherein the lead-frame package further comprises a plurality of ground wires connected to an electrical ground, and the ground wires are connected between the chip and the die pad and positioned at both sides of the characterized wires.

6. The lead-frame package of claim 1, wherein the characterized lead structure has a volume greater than that of each generic lead.

7. An electrical connection structure for electrically connecting a chip and a substrate, comprising:
   a plurality of generic leads connected to the substrate;
   at least a characterized lead structure connected to the substrate, wherein the characterized lead structure has a cross-sectional area perpendicular to the direction of signal transmission greater than that of each generic lead;
   a plurality of generic wires connecting the chip to the generic leads respectively; and
   at least a characterized wire connecting the chip to the characterized lead structure, wherein the characterized wire and the characterized lead structure transmit a same signal between the chip and the substrate.

8. The electrical connection structure of claim 7, wherein the electrical connection structure comprises a plurality of characterized wires, the characterized lead structure comprises a plurality of characterized leads, each of the plurality of characterized leads having a profile identical to the generic lead, and the characterized wires connect a same signal bonding pad on the chip to the characterized leads respectively.

9. The electrical connection structure of claim 7, wherein the characterized lead structure is a single block lead.

10. The electrical connection structure of claim 7, wherein the substrate comprises a pad electrically connected to the characterized lead structure.

11. The electrical connection structure of claim 7, wherein the characterized lead structure has a volume greater than that of each generic lead.

12. A signal transmission structure using a lead frame, suitable for transmitting signal from a chip to an external circuit through the lead frame, the signal transmission structure comprising:
   at least a high frequency transmission circuit comprising a high frequency signal lead structure and at least a high frequency signal wire, wherein the chip is electrically connected to the external circuit through the high frequency signal wire and the high frequency signal lead structure, the high frequency signal wire connects the chip to the high frequency signal lead structure, and the high frequency signal lead structure is used for transmitting a single signal through the high frequency signal wire, and the high frequency signal lead structure is provided by the lead frame; and
   a plurality of generic transmission circuits each comprising a generic lead and a generic wire, wherein the chip is electrically connected to the external circuit through the generic wires and the generic leads, and the generic wires connect the chip to the generic leads respectively, and the generic leads are provided by the lead frame, wherein the high frequency signal lead structure has a cross-sectional area perpendicular to the direction of signal transmission greater than that of each generic lead.

13. The signal transmission lead frame structure of claim 12, wherein the high frequency signal lead structure comprises a plurality of high frequency signal leads, each of the plurality of high frequency signal leads having a profile identical to the generic lead, and the high frequency transmission circuit comprises a plurality of high frequency signal wires connected a same signal bonding pad on the chip to the high frequency signal leads respectively.

14. The signal transmission lead frame structure of claim 12, wherein the high frequency signal lead structure is a single block lead.

15. The signal transmission lead frame structure of claim 12, wherein the external circuit comprises a substrate comprising a pad electrically connected with the high frequency signal lead structure.

16. The signal transmission lead frame structure of claim 12, wherein the high frequency signal lead structure has a greater volume than that of each generic lead.

* * * * *